United States Patent [19]

Goldner et al.

[11] Patent Number: 5,189,550

[45] Date of Patent: * Feb. 23, 1993

[54] ION-BEAM BASED DEPOSITION OF COATINGS FOR ELECTROCHROMIC DEVICES

[75] Inventors: Ronald B. Goldner, Lexington; Floyd O. Arntz, Newtonville; Bertrand Morel, Arlington; Terry E. Haas, Sudbury; Kwok-Keung Wong, Watertown, all of Mass.

[73] Assignee: Tufts University, Medford, Mass.

[*] Notice: The portion of the term of this patent subsequent to May 23, 2006 has been disclaimed.

[21] Appl. No.: 787,302

[22] Filed: Dec. 13, 1991

Related U.S. Application Data

[62] Division of Ser. No. 405,271, Sep. 11, 1989, Pat. No. 5,051,274.

[51] Int. Cl.[5] .......................... G02F 1/01; B05D 3/06
[52] U.S. Cl. ................................. 359/273; 359/269; 359/270; 359/275; 427/523
[58] Field of Search ..................... 359/270, 273, 275

[56] References Cited

U.S. PATENT DOCUMENTS

| | | | |
|---|---|---|---|
| 4,225,216 | 9/1980 | Boyd et al. | 359/273 |
| 4,451,498 | 5/1984 | Hashimoto et al. | 427/38 |
| 4,465,339 | 8/1984 | Baucke et al. | 359/267 |
| 4,500,174 | 2/1985 | Conner | 359/267 |
| 4,664,934 | 5/1987 | Ito et al. | 427/38 |
| 4,687,560 | 8/1987 | Tracy et al. | 204/164 |
| 4,775,549 | 10/1988 | Ota et al. | 427/38 |
| 4,832,463 | 5/1989 | Goldner et al. | 359/270 |
| 4,973,141 | 11/1990 | Baucke et al. | 359/267 |
| 5,069,535 | 12/1991 | Baucke et al. | 359/273 |

*Primary Examiner*—Rolf Hille
*Assistant Examiner*—Mahshid Saadat
*Attorney, Agent, or Firm*—Kriegsman & Kriegsman

[57] ABSTRACT

Thin film coatings for solid state storage batteries and electrochromic energy conservation devices are now formed on low temperature glass and plastic substrates by an ion-assisted RF deposition process. The attachment of such coated glass or plastic substrates to existing windows in situ allows ordinary plate glass windows in homes, office buildings and factories to be converted to "smart-windows" resulting in a substantial savings in heating and air conditioning costs.

5 Claims, No Drawings

ION-BEAM BASED DEPOSITION OF COATINGS FOR ELECTROCHROMIC DEVICES

This is a divisional of application Ser. No. 405,271, filed Sep. 11, 1989, now U.S. Pat. No. 5,051,274.

BACKGROUND OF THE INVENTION

"Smart-Windows" such as described in U.S. Pat. No. 4,832,463 entitled "Thin Film Ion-Conducting Coating", primarily consist of thin coatings on a transparent substrate whereby the reflective and transmissive properties of the electrochromic coatings can be electrically controlled. This Patent is incorporated herein for reference purposes and should be reviewed for its description of durable, environmentally stable materials that meet many of the automotive, aircraft and military performance specifications.

A first use for such "smart-windows" is in existing buildings wherein the expense of replacing existing plate glass windows with "smart-windows" would be prohibitably expensive.

The aforementioned U.S. Patent suggests depositing the electrochromic device on a flexible plastic substrate, such as mylar, which is a trademark of DuPont Company for a flexible polyester film. The provision of the electrochromic coatings on the flexible mylar film would transform ordinary windows to so called "smart-windows", when the electrochromic mylar is attached to the interior or exterior surface of such windows.

However, when electrochromic materials are deposited by conventional vacuum deposition techniques such as thermal evaporation or RF sputtering, on to a transparent substrate for all but one of the materials the substrate must remain at an elevated temperature in order to control the electrical and optical properties of the device. Therefore, the use of conventional vacuum deposition techniques has heretofore not proved feasible for conventional plastic materials since the plastics deteriorate when subjected to high temperatures for the required periods of time.

Another impediment to the widespread commercialization of electrochromic smart windows is the occurrence of pinholes and other electronically-shorting pathways which result from ordinary low temperature depositions of the middle layer, since such deposition techniques lead to porous, low density layers.

An additional impediment to the widespread commercialization of electrochromic smart windows is that long deposition times are required to build-up the five coatings used to provide the electrochromic effect. With the method described in the aforementioned U.S. Patent, the two outer layers must exhibit a high degree of crystallinity whereas the middle layer must remain amorphous. The common substrate was accordingly heated during the deposition of the first two layers, cooled during the deposition of the third middle layer and thereafter heated during the deposition of the final forth and fifth layers. Whereas the long heating and cooling cycles are not conducive to commercial production, the substrate high temperature heating requirement eliminates most commercially available plastic materials.

A paper entitled "Modification of the Optical and Structural Properties of Dielectric $ZrO_2$ Film by Ion-Assisted Depositions" which appeared in the Journal of Applied Physics, 55, January, 1984, describes the ion-assisted deposition of $ZrO_2$ films on both heated and unheated substrates. The $ZrO_2$ films were prepared by electron-beam evaporation of $ZrO_2$ accompanied by irradiation with a 600-eV argon beam. When the argon beam was employed, the refractive index and mass density of the $ZrO_2$ on the heated substrate, however, was higher than the refractive index and mass density of the $ZrO_2$ on the unheated substrate.

One purpose of the instant invention, accordingly, is to provide a method for depositing high mass density electrochromic device materials upon transparent substrates by means of a rapid deposition process that does not require a heated substrate to achieve the desired electrochromic effects.

SUMMARY OF THE INVENTION

Electrochromic device coatings are prepared on room temperature plastic and glass transparent substrates by an RF deposition process which includes ion-assisted deposition. In the case of electrochromic smart windows, the first conducting layer, counter-electrode layer, ion conducting layer, electrochromic layer and second conducting layer are each deposited on the room temperature substrates by bombardment of the material accompanied by an oxygen ion beam energy of 400 electron-volts or less.

DESCRIPTION OF THE PREFERRED EMBODIMENT

Before describing the Preferred Embodiment, it is helpful to review the teachings of the aforementioned U.S. Pat. No. 4,832,463 which describes the composition of a five layer electrochromic energy conservation and electronic rechargeable battery device. The first electron-conducting layer which is directly deposited on a glass or plastic substrate comprises a tin-doped indium oxide (ITO) transparent coating to which an electrode is attached by means of a low temperature indium metal solder. The electrochromic layer consisting of $WO_3$ is deposited over the ITO layer and the ion-conducting layer of $Li_2O:Nb_2O_5$ which is electron-resistive and ion-conductive is deposited over the electrochromic layer. The counter-electrode layer consisting of $In_2O_3$ is deposited over the ion-conducting layer. A second ITO transparent coating is deposited over the counter-electrode layer and a second electrode is attached to the second ITO layer by means of the low temperature indium metal solder. As described in the referenced U.S. Patent, the starting materials for the mixed oxide components are prepared in excess of stoichiometry such that the resulting layers are stoichiometric in composition to insure the selective ion and electron transport properties.

In accordance with the instant invention, all five layers are prepared by a continuous deposition process within a controlled inert atmosphere in which the specific mixed oxides are thermally evaporated from an electrically heated tungsten or tantalum metal boat or from an electron beam-heated graphite crucible. The oxides condense onto an unheated glass substrate while simultaneously bombarding the substrate with a 200–300eV oxygen beam at an incident angle varying between 0 and 80 degrees. The electrochromic layer, for example, was prepared from a mixture comprising 90 wt. % $WO_3$ and 2.5 wt. % $Al_2O_3$ which was allowed to condense on the unheated coated glass substrate approximately 5–30 cm away. The deposition was separately obtained using (a) the 200–300eV oxygen beam (b) the 200–300eV argon beam (c) no beam during deposition.

The electrochromic layer was also deposited on a Mylar plastic film. The results showed that by using the 200–300eV oxygen beam the $WO_3$ film exhibited good transparency and readily colored upon ion-insertion with corresponding measured high near-infrared reflectance. The $WO_3$ film formed with the 200–300eV argon beam or no beam at all appeared to be chemically reduced and hence visibly colored. X-ray diffraction measurements for such depositions exhibited no crystallinity while lithium-insertion produced no increase in free electron near-infrared adsorbtion or reflection which is a measure of the degree of electrochromic activity.

On the other hand, the $WO_3$ film formed with the 200–300eV oxygen beam was visibly transparent, and X-ray diffraction measurements for such depositions indicated that the films were crystalline, and lithium insertion produced a marked increase in near-infrared reflection, thus indicating a high degree of desirable electrochromic activity. Furthermore, such depositions exhibited higher mass densities than when no energetic beam of argon or oxygen was used.

Having thus described our invention, what we claim as new and desire to seek by Letters Patent is:

1. An electrochromic device comprising:
   a light transmissive substrate having a first layer of electrically-conductive material deposited thereon by thermal evaporation;
   a layer of tungsten oxide deposited on said first layer by thermal evaporation of tungsten oxide within a stream of oxygen or argon ions;
   a layer of ion conductive-electron resistive material deposited on said tungsten oxide by thermal evaporation;
   a counter-electrode layer deposited on said electron resistive-ion conductive layer by thermal evaporation; and
   a second layer of electrically-conductive material on said counter-electrode layer by thermal evaporation.

2. The electrochromic device of claim 1 wherein said light-transmissive substrate comprises plastic or glass.

3. The electrochromic device of claim 1 wherein said first and second electrically-conductive materials comprise indium and tin oxides.

4. The electrochromic device of claim 1 wherein said ion conductive-electron resistive layer comprises a lithiated oxide.

5. The electrochromic device of claim 1 wherein said counter-electrode layer comprises indium oxide.

* * * * *